(12) United States Patent
Carlach et al.

(10) Patent No.: US 6,745,362 B1
(45) Date of Patent: Jun. 1, 2004

(54) METHOD AND DEVICE FOR ERROR CORRECTION CODING AND CORRESPONDING DECODING METHOD AND DEVICE

(75) Inventors: Jean-Claude Carlach, Rennes (FR); Cyril Vervoux, Limoges (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/744,849

(22) PCT Filed: Aug. 2, 1999

(86) PCT No.: PCT/FR99/01912

§ 371 (c)(1), (2), (4) Date: Mar. 22, 2001

(87) PCT Pub. No.: WO00/08766

PCT Pub. Date: Feb. 17, 2000

(30) Foreign Application Priority Data

Jul. 31, 1998 (FR) .......................... 98 10089
Aug. 7, 1998 (FR) .......................... 98 10316
Dec. 31, 1998 (FR) .......................... 98 16788

(51) Int. Cl.$^7$ .......................................... H03M 13/05
(52) U.S. Cl. ...................................... 714/755; 714/757
(58) Field of Search .................................. 714/755, 757

(56) References Cited

U.S. PATENT DOCUMENTS

| | | | |
|---|---|---|---|
| 4,933,956 A | * 6/1990 | Forney, Jr. .................. | 375/341 |
| 5,218,619 A | * 6/1993 | Dent ........................... | 370/209 |
| 5,293,434 A | * 3/1994 | Feig et al. ................... | 382/234 |
| 5,357,454 A | * 10/1994 | Dent ........................... | 708/410 |
| 5,465,269 A | * 11/1995 | Schaffner et al. ........... | 375/144 |
| 5,594,742 A | * 1/1997 | Hemmati ...................... | 714/792 |
| 5,757,767 A | * 5/1998 | Zehavi ......................... | 370/208 |
| 5,771,244 A | * 6/1998 | Reed et al. .................. | 714/752 |
| 5,784,293 A | * 7/1998 | Lipa ............................ | 708/410 |
| 6,308,295 B1 | * 10/2001 | Sridharan et al. ........... | 714/755 |

OTHER PUBLICATIONS

Benedetto et al., "Iterative Decoding of Serially Concatenated Codes with Interleavers and Comparison with Turbo Codes," IEEE Global Telecommunications Conference, vol. 2, pp. 654–658, Nov. 1997.

Benedetto et al., "Analysis, Design and Iterative Decoding of Double Serially Concatenated Codes with Interleavers," IEEE Journal on Selected Areas in Communications, vol. 16, No. 2, pp. 231–244, Feb. 1998.

Fazel, K., "Iterative Decoding of Generalized Concatenated Blokh–Zyablov–Codes," IEEE International Conference on Communications, vol. 1, pp. 96–101, Jun. 1996.

Pellizzoni et al., "Binary Multilevel Coset Codes Based on Reed–Muller Codes,"IEEE Transactions on on Communications, vol. 42, No. 7, pp. 2357–2360, Jul. 1994.

Battail, "A Conceptual Framework for Understanding Turbo Codes," IEEE Journal on Selected Areas in Communications, vol. 16, No. 2, pp. 245–254, Feb. 1998.

(List continued on next page.)

*Primary Examiner*—Stephen M. Baker
(74) *Attorney, Agent, or Firm*—Merchant & Gould, P.C.

(57) ABSTRACT

The invention concerns a method and a device for error correction coding associating with a data source series a coded data block, to be transmitted to at least one receiver comprising at least two coding stages ($21_i$) each comprising at least two basic coding modules ($22_{i,j}$), each of said coding stages receiving a series of data to be processed, distributed between said basic coding modules, and delivering a series of processed data, derived from said basic coding modules and at least one branching stage ($23_i$), said branching stage being inserted between two successive coding stages, a first coding stage and a second coding stage, and distributing the processed data derived from each basic coding module of said first coding stage between at least two basic coding modules of said second stage. The invention also concerns the corresponding decoding method and device, based on path likelihood.

63 Claims, 8 Drawing Sheets

OTHER PUBLICATIONS

International Search Report in French, dated Nov. 16, 1999.

Marvasti, et al., "Using FFT for Error Correction Decoders", IEE Colloq. on DSP Applications in Communications Systems, Mar. 1993, pp 9/1–9/4.*

Blahut, "Theory and Practice of Eror Control Codes", Addison–Wesley Pub. Co., 1983, pp. 215–224, 233–242, 247, 275–281, 317–323.*

Marvasti, et al., "The Application of Walsh Transform for Forward Error Correction", Proc. ICASSP '99, Mar. 15–19, 1999, pp.*

Gumas, "A Century Old, the Fast Hadamard Transform Proves Useful in Digital Communications", Personal Engineering and Instrumentation News, Nov. 1997, pp. 57–63.*

* cited by examiner

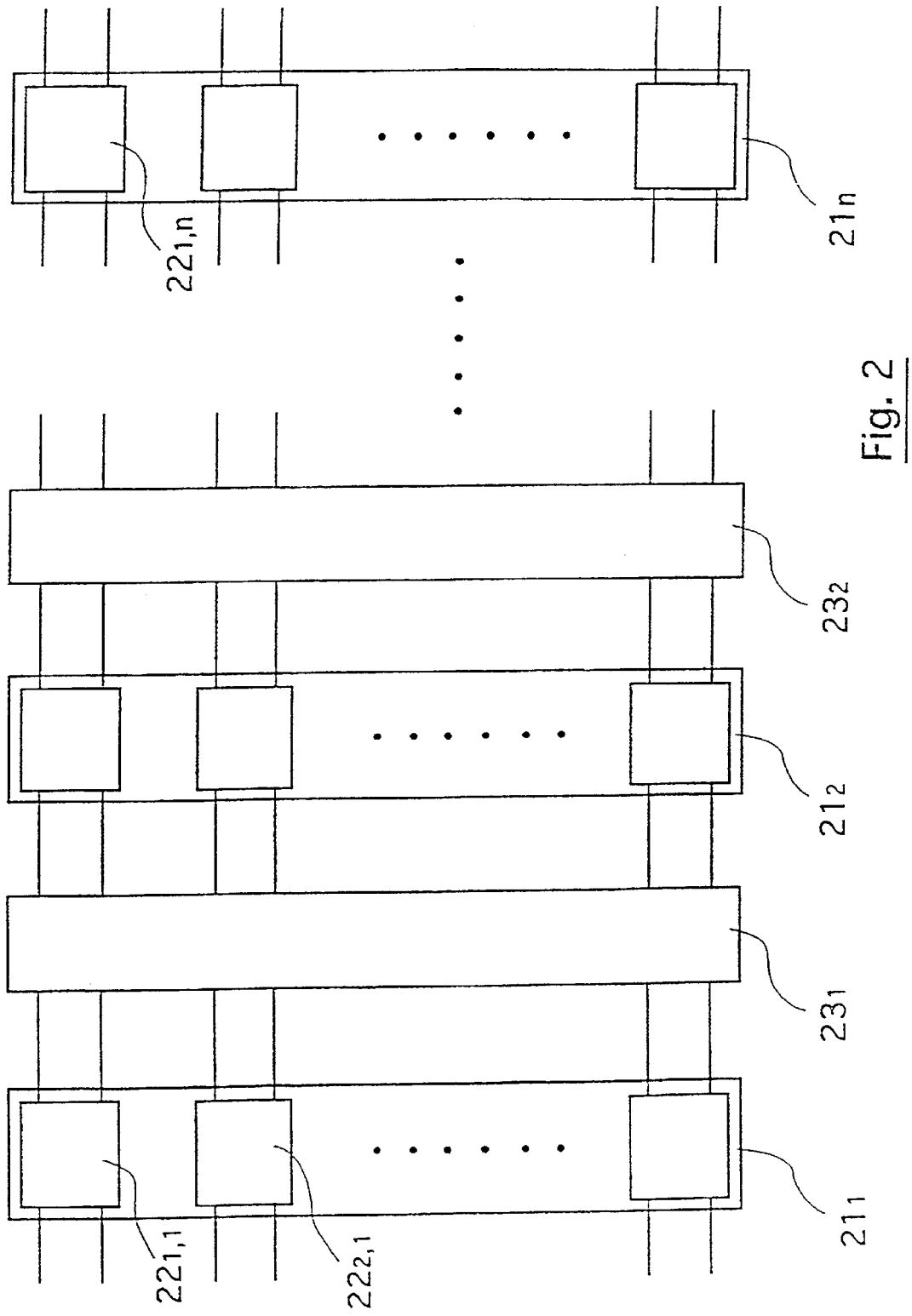

METHOD AND DEVICE FOR ERROR CORRECTION CODING AND CORRESPONDING DECODING METHOD AND DEVICE

The field of this invention is coding of numeric data. More precisely, the invention relates to error correction codes. The invention is particularly but not exclusively applicable to the coding of source data organized into data blocks independent from each other and therefore that need to be coded and decoded individually, and coding of data flows (convolutional coding).

Many coding techniques for correcting transmission errors are already known. In particular, refer to documents by F. J. McWilliams and N. J. A. Sloane [1], S. B. Wicker [2], and V. Pless et al [3] (all references mentioned in this application have been grouped in the appendix to simply reading). Error correction codes are used to correct transmission errors inherent to all communication channels. Thus, they are very frequently used in telecommunications, remote broadcasting and information storage, for example on laser disks and magnetic disks, etc.

For example, these errors may be caused by thermal noise in electronic components of the receiver, accidental or deliberate electromagnetic interference, echoes or multiple propagation in the case of radio propagation (for example for radiotelephony systems such as GSM, digital radio broadcasting such as DAB or digital television such as DVB) or in an electrical power network (for example for telecommunications on the electrical network).

The first studies on error correction codes date from the 1940s. In his articles written in 1948, Claude Shannon [4] wrote the foundations of the information theory based on which digital communication systems are still (and always will be?) designed.

One of Shannon's results is his theorem concerning the limiting capacity of a communication channel, which is defined by the following well known formula:

$$C = B \cdot \mathrm{Log}\left(1 + \frac{S}{N}\right)$$

where the capacity C of the channel is an information throughput expressed in bits/s, B is the pass band of the channel in Hz and S/N is the ratio of the signal and noise powers in the pass band.

This theorem is expressed as follows: "There is a transmission capacity C (in bits per second) associated with every channel. There are error correction codes such that the information can be transmitted through a channel at a rate lower than its capacity C with an arbitrarily low bit error rate by using a sufficiently long error correction code".

Unfortunately, Shannon's theorem is no more than a proof of existence. His publication was the starting point for a search for "good" codes that has now been going on for 50 years. The main codes that have attracted the attention of the telecommunications community were firstly block codes to transmit bit packets; Hamming codes, Golay codes, Reed-Muller codes, BCH codes, Reed-Solomon codes, etc.

The principle of block error correction codes was invented by R. W. Hamming in 1950: starting from k useful information bits, (n−k) redundancy bits are calculated using modulo 2 additions of k information bits, therefore the total length of each block, also called a code word, is n bits. On reception, if there are any errors present in the received n-bit word, the presence of the (n−k) redundancy bits adjacent to the k useful information bits can be used to correct some of the errors present.

If the ratio of the signal/noise powers exceeds a particular value, then the cost of the information flow occupied by code redundancy bits is more than compensated by the reduction, or possibly almost complete elimination, of the bit error rate (BER) after decoding. This gain in performance is called the coding gain, for a fixed BER, and is given in decibels (dB). A coding gain of 3 dB means that the power of the signal transmitted with coding can be halved compared with the same BER without coding (3 dB≈10.$\mathrm{Log}_{10}$ (2)).

Another large and more recent coding family is the convolutional codes family introduced by P. Elias [5] in 1955. These codes transform an infinite series of information symbols into several other infinite series of information symbols. These codes were invented to transmit continuous information flows. A. J. Viterbi [6] (in 1967) and G. D. Forney [7] (in 1973) have demonstrated the possibilities of efficiently decoding "small" convolutional codes with the "Viterbi" algorithm (an algorithm based on the dynamic programming theory (See Bellmann [8] (1957)).

Block (error correction) codes and convolutional codes may be methoded using the same theoretical tools and the same decoding methods. Block codes and convolutional codes can be represented by special graphs called "trellis" from which their weight distribution can be calculated and that can be used for decoding using the Viterbi algorithm (see Forney [7] and McEliece [9]).

Each code word is represented by a different path in the trellis and the best path, in other words the code word closest to the received word, is found by decoding using the Viterbi algorithm. But for a block code or for a convolutional code, the complexity of the decoding increases exponentially at the power of 2(n−k) for a block code, and 2v for a convolutional code (were n is the size of the memory of the convolutional coder). The dilemma is that as the length and power of the code increases, it corrects more errors, but it is also more expensive in time and decoding equipment.

Recently, in 1993, C. Berrou and A. Glavieux [10] presented a new coding scheme usually called the "turbo-code". There are four main concepts in turbo-codes:

1) Use recursive convolutional coding, in other words with an infinite pulse response (and not a finite pulse response as is conventionally used).
2) Code useful information bits once in their initial order, then code the same useful data a second time but in a different order, in other words swapped around. The useful bits are transmitted only once, and coders only transmit their redundancies. Swapping, also called interlacing, is "magic" since the code is able to correct more errors as it becomes larger. Interlacing decorrelates errors created by the transmission channel.
3) Use soft decoding techniques introduced by Bahl et al (BCJR algorithm) [11], G. Battail [12], or Hagenauer (SOVA ("Soft-Output Viterbi Algorithm") [13], etc.
4) By definition, let the output Li (of each elementary soft decoder i receiving "information" Li(0) in iteration i) be the sum of the received initial "information L0 and extracted or extrinsic information Wi such that LI=L0+Wi. In the next iteration (i+1), only part of the extrinsic information is reinjected such that Li+1(0)=L0+ai+1Wi, where the coefficients ai vary from 0 in the first iteration and can reach 1.0 in the last iteration. There coefficients ai are optimized to minimize the BER starting from a given signal/noise ratio. Strictly speaking, the L and W quantities are logarithms of the probability ratio and not information quantities.

Berrou and Glavieux's first turbo-codes were convolutional codes based on a large swap matrix (256×256=65536)

with performances close to the Shannon limit for low signal to noise ratios. But some of the most recent telecommunication and radio broadcasting systems require small information packets to be transmitted (for example radio back scattering, mobile telephone, cordless ATM, Internet, etc.).

Furthermore, the disadvantage of large swaps is an incompressible delay in methoding which can be very annoying in a real time service, for example as in a telephone conversation. This is why research is continuing to find good block "turbo-codes". In particular, R. Pyndiah et al [14] have adapted the iterative decoding concept to Elias product codes [5] for small block codes (n<1024). And recently in 1997, Berrou et al [17] adapted their turbo-codes (by closing trellis) to the construction of high performance block codes of this order of size (n<2048) called FOTC (Frame Oriented Turbo Codes).

Block codes presented by Berrou and Pyndiah are some of the best known codes for their size and efficiency categories (0.5<r<1), for a decoding complexity that enables manufacturing of hardware with an excellent quality/price ratio.

For a given block length n and for a given correction capacity $$t=[(d-1)/2]$$

(where d is the minimum Hamming distance between two code words), there are more or less severe upper limits to the performances that can be expected. The best of the known upper limits is the McEliece et al limit [1,2], represented (11) as a solid line in FIG. 1. The Gilbert-Varshamov limit 12 is also shown in a dashed line.

For a fixed relative d/n distance, it is impossible to find a code with an efficiency k/n greater than the McEliece limit. Furthermore, it is said that the code family is good if:

$$\lim_{n\to\infty}(d/n) \neq 0$$

For example, for an efficiency of k/n=0.5, the McEliece limit on the minimum relative distance is d/n £ 0.18. Therefore, if n=1024 bits, the maximum number of errors that could be corrected is 91.

At the present time, turbo-codes are the most efficient correction codes for a BER of the order of 10-4. The improvement compared with other techniques is not as significant when this BER is very low, for example of the order of 10-10.

Furthermore, the efficiencies obtained (conventionally ½) are not optimum.

One particular objective of the invention is to overcome these various disadvantages in the state of the art.

More precisely, one purpose of the invention is to provide an error correction coding method with better performances than known codes. In particular, one objective of the invention is to supply such a method very close to the McEliece limit.

Another purpose of the invention is to supply this type of coding method that can give a very large gain particularly when error rates are very low, of the order of 10-10.

Another purpose of this invention is to supply this type of method to give better efficiency than is possible with known coding techniques for a given error rate (for example to change from an efficiency ½ to ¼ or ⅛).

Another purpose of the invention is to supply this type of coding method that is adapted to coding of data blocks with an average length n, for example between 128 and 2048 bits.

Yet another purpose of the invention is to supply a coding method of this type that can easily be implemented in VLSI.

Another purpose of the invention is to supply a corresponding decoding method with reasonable complexity, and particularly that has a ratio or performance/complexity that is competitive compared with the best known codes.

These purposes, and others that will become clear later, are achieved according to the invention using an error correction coding method of the type associating a block of coded data with a series of source data, to be transmitted to at least one receiver, comprising:

at least two coding steps each comprising at least two basic coding modules, each of said coding steps receiving a series of data to be methoded, distributed between said basic coding modules, and outputting a series of methoded data from said basic coding modules;

and at least one mixing step, said mixing step being inserted between two successive coding steps, a first coding step and a second coding step, distributing the methoded data output from each basic coding module in said first coding step between at least two basic coding modules in said second step.

This type of coding method can give a large minimum distance for a given efficiency. Thus the minimum distance of this type of code (192, 96) with efficiency ½, built based on the example described below, is close to 30. Furthermore, the weight distribution is close to optimum.

Advantageously, each step corresponds to a stage in the structure of a corresponding coding device. This structure facilitates understanding of the invention. However, the device can use the method according to the invention in any other suitable form, and particularly in an essentially software form in which one (or several) methodors perform the corresponding methoding.

In this case, mixing means any type of distribution, swapping, rotation, and more generally functions of several inputs to the mixing step (additions, multiplications, weightings, etc.).

As will be seen later, this method may easily be implemented in the form of a pipe-line machine, particularly in a VLSI.

Advantageously, a systematic or pseudo-systematic code is used.

Thus, said block of coded data to be transmitted advantageously comprises at least some of said source data and at least some methoded data output from the last coding stage, and preferably all said source data.

According to one advantageous embodiment of the invention, said coded data block comprises methoded data output from at least two coding steps. For example, data calculated in the last step, and in at least one previous step, can be used. An appropriate compromise will be chosen between the decoding quality (taking account of the largest possible amount of information) and the efficiency, depending on the needs.

In one particular embodiment, at least one of said mixing steps uses at least one swap matrix. It would also be possible to make at least one of said mixing steps distribute the methoded data to at least two distinct coding steps. Obviously, the two aspects may be combined in the same device.

Similarly, at least one item of said source data and/or at least one item of said methoded data may be duplicated at least once, in order to form at least two items of data to be methoded.

Another possibility would be that at least one of said source data would be directly input into a coding step other than the first coding step.

Obviously, these various aspects may be combined and chosen preferably to give the best coding, while decoding remains sufficiently simple and efficient.

According to a particular embodiment of the invention, the coding method comprises at least two of said coding units each comprising at least two coding steps and at least one mixing step inserted between two successive coding steps, said source data each being input into each of said coding units in different input orders.

In particular, it may comprise at least one mixing unit, modifying the order in which said source data are input into one of said coding units.

This thus gives two (or more) separate sets of redundancy data.

According to one advantageous embodiment, the coding method applies puncturing on at least some of said data to be methoded and/or on at least some of said methoded data.

Advantageously, said coding modules use a redundancy code with length n−k less than or equal to 12.

As already mentioned, the invention is particularly applicable to coding of data blocks with a relatively limited size.

According to a first embodiment that is particularly easy to implement, all said coding modules are identical. For example, said coding modules may use a Reed-Müller code.

Advantageously, in this case at least one of said mixing steps uses a "parity" swap that groups inputs with even indexes, and inputs with odd indexes, at the output.

According to one preferred embodiment, the swap thus performs the following operations for a swap length k:

inputs with even indexes i=2p are sent to outputs j=p, p=0, 1, . . . int[k/2]−1;

inputs with odd indexes i=2p+1 are sent to outputs j=p int[k/2], where int[x] is the function giving the integer part of x.

According to one advantageous aspect of the invention, the coding method uses mixing steps involving a parity swap, and comprises:

three coding steps each comprising three basic coding modules;

three coding steps each comprising four basic coding modules;

five coding steps each comprising nine basic coding modules, said basic coding modules using an extended Hamming code [8,4].

According to one advantageous embodiment, said basic coding modules are built using elementary coding blocks associating the (x0, x0+x1) pair with the (x0, x1) pair.

Therefore in this approach, there are two construction (or nesting) levels for the final code.

Another code that is advantageous in that it is extremely simple is a (4,2) code, for example that associates the values (x0, x1, x0, x0+x1) with the (x0, x1) pair. The trivial code that systematically associates x0 with x0 can also be used, in combination with other basic codes like that mentioned above.

This type of code can give very simple embodiments, for example based on tables of values, due to the small number of possible states. For example, they can be used to build the Hamming H code [8, 4, 4].

According to another embodiment, at least two of said coding modules are different.

Another advantageous possibility is that at least one of said basic coding modules is used in a trellis defining a set of paths bijectively associated with a set of code words, and outputting optimum path metrics according to a predetermined criterion.

Codes built on this principle are called "Cortex II codes", and codes obtained using the previous technique are called "Cortex I codes".

Advantageously, at least one of said mixing steps generates at least one output that is a function of at least two inputs to said mixing step.

In other words, at least one (and conventionally all) coder outputs are distributed to several coder inputs in the next stage.

In particular, said function can use at least one summation, a multiplication and/or a weighting.

According to one advantageous aspect of the invention, said inputs to said function are path metrics.

Furthermore, the structure can advantageously be looped back. Therefore, said coding and mixing steps are iterated at least twice, the first and last mixing steps forming a single step.

Advantageously, said method comprises a step in which at least one of the following elements is checked and/or adjusted:

coding type and/or characteristic used by at least one of the basic coding modules;

mixing used by at least one of said mixing steps;

puncturing used on at least some of said data to be methoded and/or on at least some of said methoded data;

number of coding steps.

Said check and/or said adjustment can systematically act on a given period and/or as a function of at least one item of information representative of at least one of the aspects belonging to the group including:

at least one characteristic of the transmission channel;

at least one characteristic of the receiver;

at least one characteristic of the source signal.

The invention also relates to error correction coding devices using the method described above. In this type of device, a coded data block is associated with a series of source data, and the coded data block will be transmitted to at least one receiver using:

at least two coding stages each using at least two basic codings, each of said coding stages receiving a series of data to be methoded, distributed between said basic coding and outputting a series of methoded data corresponding to said basic coding;

and at least one mixing stage, said mixing stage being inserted between two successive coding stages, a first coding stage and a second coding stage, and distributing the methoded data corresponding to each basic coding of said first coding stage between at least two basic codings of said second stage.

As described above, each of said stages may actually correspond to a component (or set of components) or it may be used by one or several methodors controlled by a corresponding program.

The invention also relates to the corresponding decoding methodes and devices. Advantageously, this type of decoding method is iterative.

Preferably, said decoding method uses at least one of the techniques belonging to the group comprising:

decoding using a structure symmetric with the structure used during coding;

exhaustive decoding, according to which all possible code words are considered and the best is selected according to a predetermined selection criterion;

Viterbi type decoding, using a decoding trellis;

Chase decoding.

Advantageously, this type of decoding method uses at least two decoding steps, including at least two decoding modules, and at least one swap step inserted between two consecutive decoding steps, said steps being symmetric with the corresponding coding steps, each of said decoding modules comprising twice as many inputs and outputs as the corresponding coding module, to assure propagation of probability values from the input to the output side of the decoder, and secondly from the output to the input side of said decoder.

The result is a gradual convergence of decoded data in the two decoding directions.

As for coding, the step concept is similar to the stage concept for the corresponding device as described below.

Advantageously, the decoding method according to the invention uses at least one iteration of the following operations:

propagation of all said probability values towards the input side of said receiver, producing a first set of estimated values;

propagation of all said probability values towards the output side of said receiver, producing a second set of estimated values.

Preferably, said decoding determines path probabilities. Thus, in each iteration, each of said elementary decoding operations can determine a state probability for each possible corresponding coding state, and the state with the highest probability can be selected.

Advantageously, said state probability corresponds to the sum of a first probability value obtained starting from information bits and a second probability value obtained from redundancy bits.

Preferably, said probabilities are determined from probability laws.

In particular, said first (or second) probability associated with a given output from one of said elementary decodings may be obtained by determining the logarithm of the sum of the exponentials of the probabilities of states connected to said output, minus the logarithm of the sum of the exponentials of the probabilities received at the input, as information bits (or redundancy bits) for states connected to said output.

In other words, the extrinsic path probabilities are thus determined.

According to a particular embodiment of the invention, the decoding method comprises the following steps:

calculate state probabilities:
"forwards": Fi, based on information bits;
"backwards": Bi, based on redundancy bits;
calculate global state probabilities:
Ei=Fi+Bi;
detect the maximum state probability Ei;
calculate the following probability values:

$$V(xj)=2\ \mathrm{Log}[\Sigma\ \exp(Ei/xj\rightarrow Ei)]-\mathrm{Log}[\Sigma\ \exp(Ei+Fi/xj\rightarrow Ei)]$$

(values propagated backwards, thus giving the information bits xj)

$$V(rj)=2\ \mathrm{Log}[\Sigma\ \exp(Ei/rj\rightarrow Ei)]-\mathrm{Log}[\Sigma\ \exp(Ei+Bi/rj\rightarrow Ei)]$$

(values propagated forwards, thus giving the redundancy bits rj)
where (Ei/xj→Ei) represents the probability of state Ei connected to output xj;
output said values to the next elementary decoding.

This step in calculating probability values could possibly be simplified by only including the state with the greatest probability in each of the exponential sums. This simplification does not significantly modify the decoding efficiency.

Preferably, when the decoding has reached a predetermined convergence criterion, possibly independent for each decoding module, an a posteriori probability is associated with each bit after equilibrium:

$$V''(xj)=\mathrm{Log}(\Sigma\ \exp(Ei/(xj=0)\rightarrow Ei)-\mathrm{Log}(\Sigma\ \exp(Ei/(xj=1)\rightarrow Ei))$$

According to one advantageous characteristic of the invention, the decoding method may be used as a coding method with the redundancy inputs being forced to 0 and the information inputs corresponding to the data to be coded.

In this case, it may be used alternately firstly for coding and secondly for decoding data, for example for duplex type applications.

According to one preferred aspect of the invention, said basic decoding modules use trellis with nodes in which addition, comparison and/or selection operations are carried out and that output optimum path metrics. Additions, multiplications and/or weightings of at least two of said optimum path metrics are carried out in at least one of said mixing steps.

Regardless of whether coding and/or decoding according to the invention is concerned, at least one of said elementary codings and/or at least one of said elementary decodings and/or at least one of said swaps can advantageously be programmed.

For example, programmable decoding elements could be programmed using at least one of the following operating methods:

as a function of a predetermined command produced by coding;

as a function of a reference sequence coded by coding;

by blind learning starting from the received data.

It will be noted that the decoding efficiency can be sufficient to perform decoding without prior knowledge of the exact code used (blind learning).

According to one advantageous embodiment of the invention, said coding performs combined source coding and channel coding, and said decoding correspondingly performs combined channel decoding and source decoding.

Advantageously, said decoding also at least partially equalizes transmission channel effects.

According to the invention, it is possible that at least some of said calculations are made using preprogrammed tables (due to the simplicity of each coding and/or decoding module).

According to one advantageous embodiment of the invention, at least some of said calculations are done using analog components. The algorithm is inherently stable and is therefore well adapted to analog calculations. In particular, this may be the case for exponential and logarithm calculations, for which these types of components are very suitable. Obviously, these calculations could also be made digitally.

According to one advantageous variant of the invention, said basic coding and decoding modules use trellis, and the structures of said coding and mixing steps for coding, and said decoding and mixing steps for decoding, are identical.

In this case, the same structure can be used for coding and decoding (duplex).

The invention also relates to decoding devices using the decoding method described above, and any device for transmission and/or reception of at least one signal coded and/or decoded using the methodes described above.

One such transmission and/or reception device comprises signal transmission and/or reception means, at least some of these signals benefiting from coding according to the invention, and the corresponding coding and/or decoding methoding means.

The efficiency of the invention is such that transmission devices and reception devices can be made simpler and/or more efficient, capable of accepting channels with severe disturbance and/or rates higher than is possible with conventional techniques, and it can be used to make a complete transmission system.

Consequently, the invention is used for applications in a large number of fields, and particularly it can be used for techniques belonging to the group comprising:

transmission and/or broadcasting of digital signals (for example for applications grouped in the ITU "IMT 2000" project);

speech recognition and/or methoding.

Other characteristics will become clearer after reading the following description of a preferred embodiment given as a simple illustrative and non-restrictive example and the attached drawings in which:

FIG. 2 illustrates the general principle of a coding device according to the invention;

Figure 1:
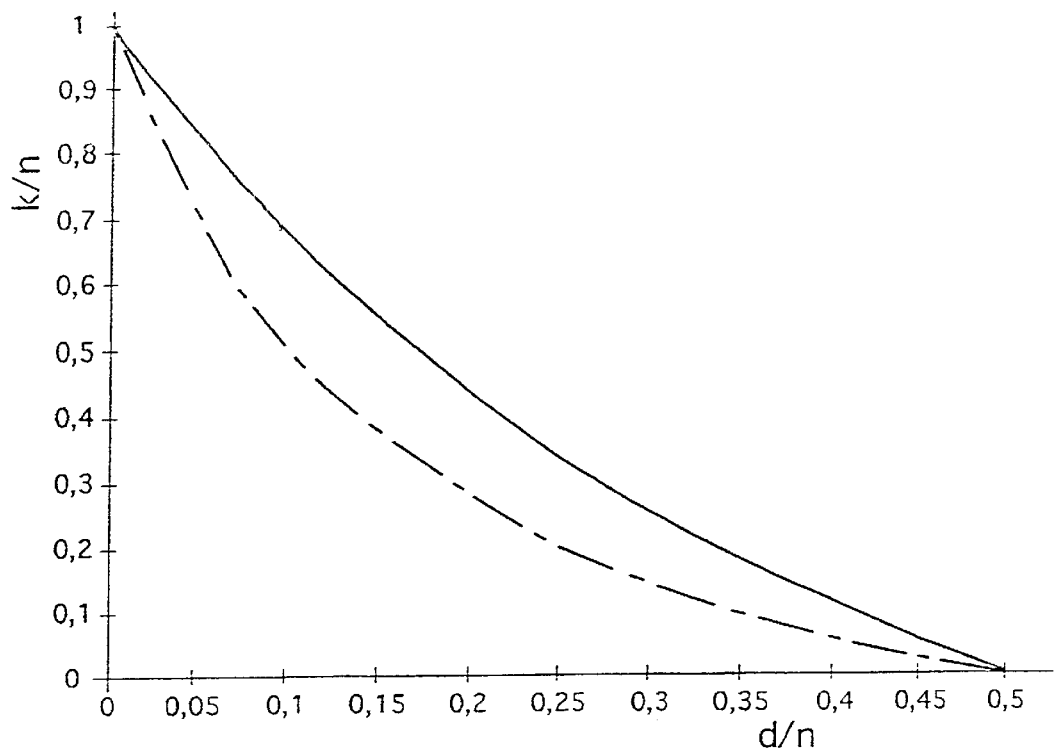
FIG. 1 illustrates the McEliece and Gilbert-Varshamov limits.
Figure 5A:
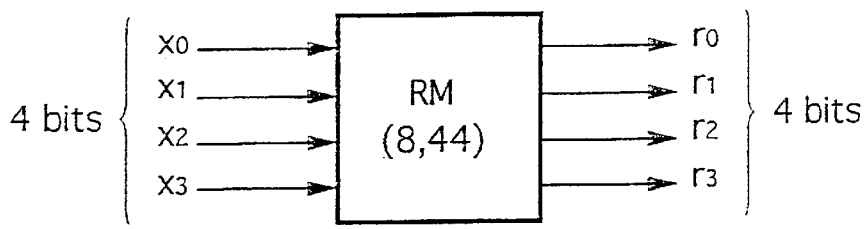
FIG. 5A illustrates a coding device using Reed-Müller coding (8, 4, 4)
Figure 5B:
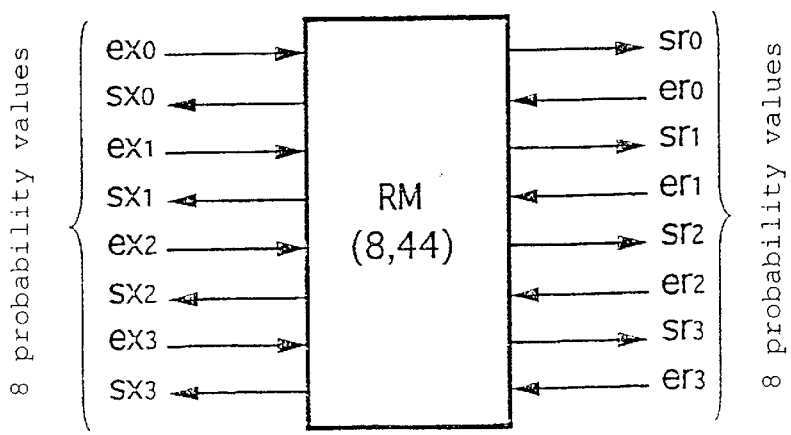
FIG. 5B illustrates a corresponding decoding module.
Figure 6:
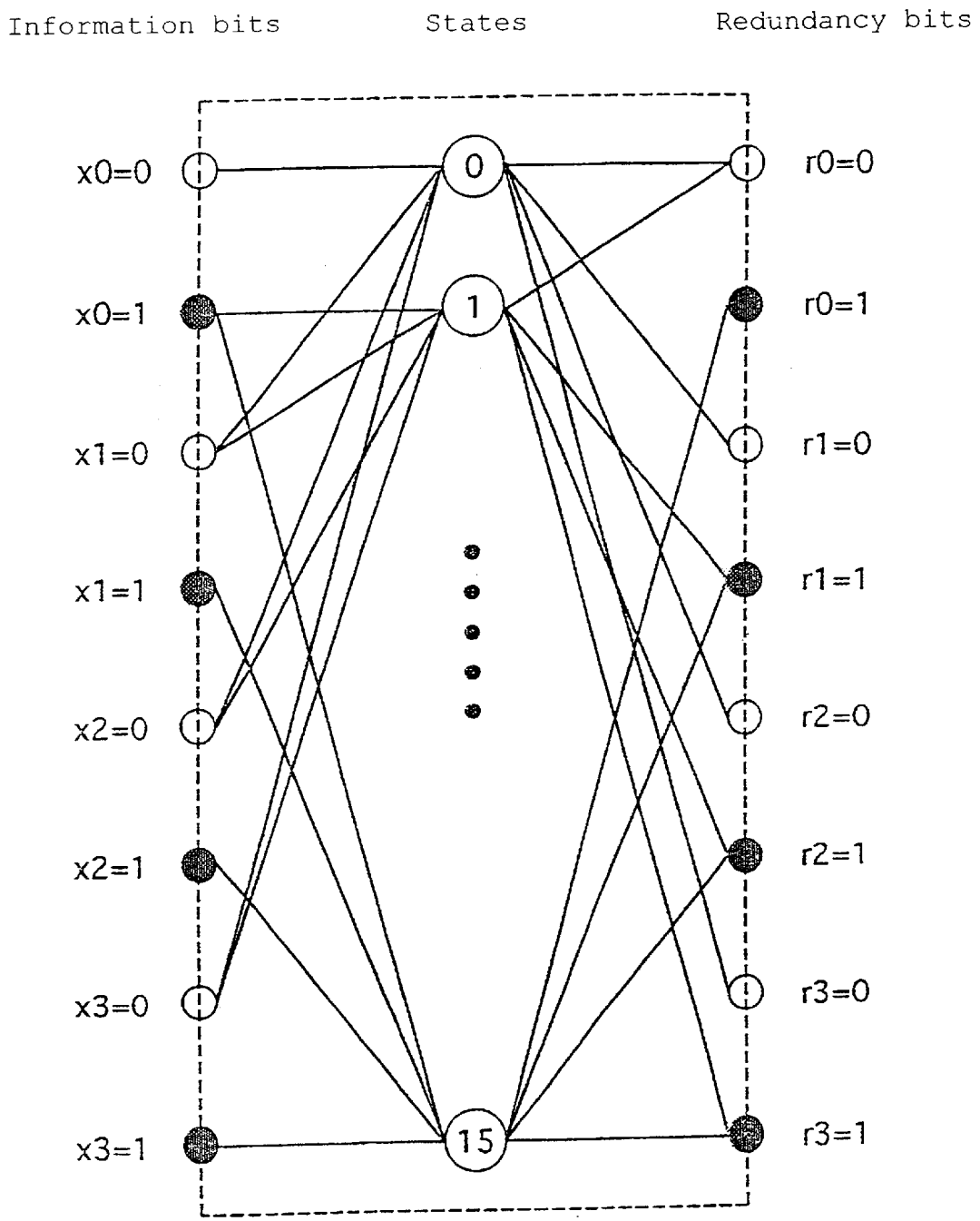
Figure 7:
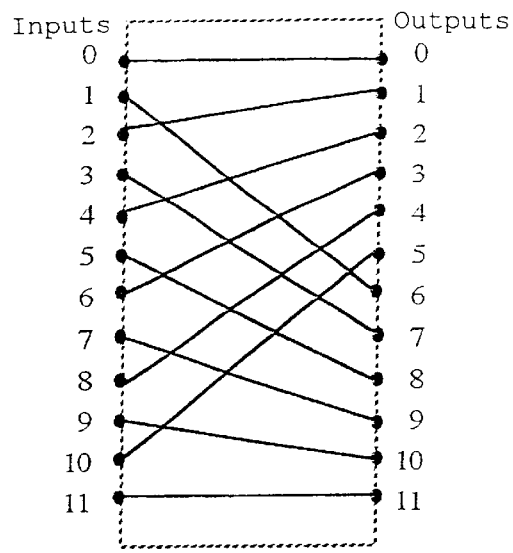
Figure 8:
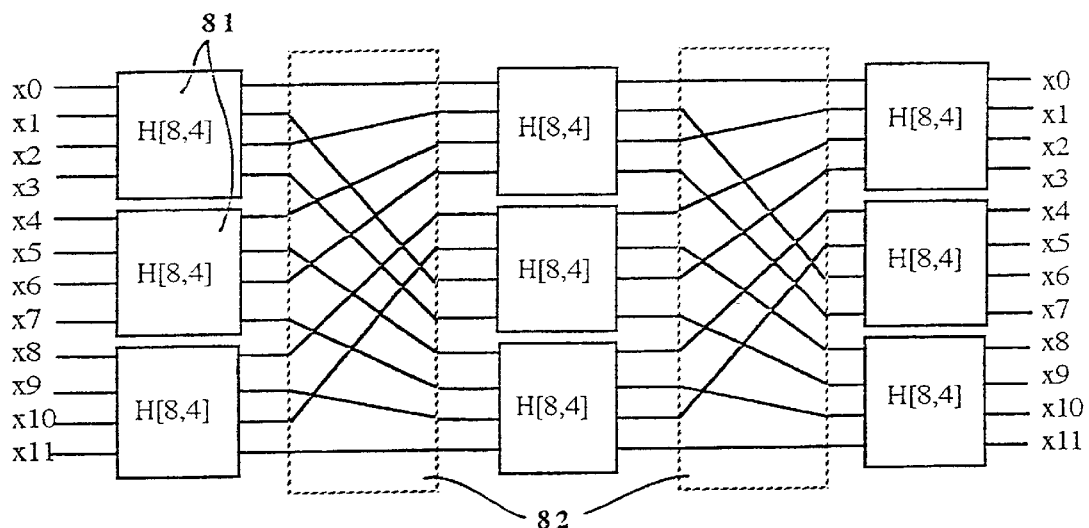
Figure 9:
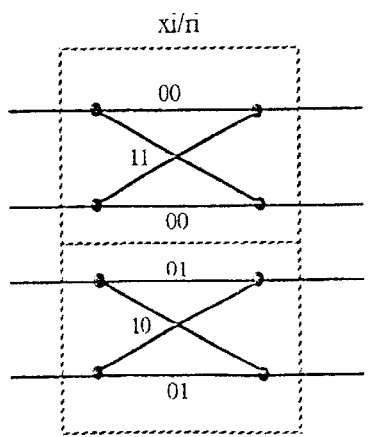
Figure 10:
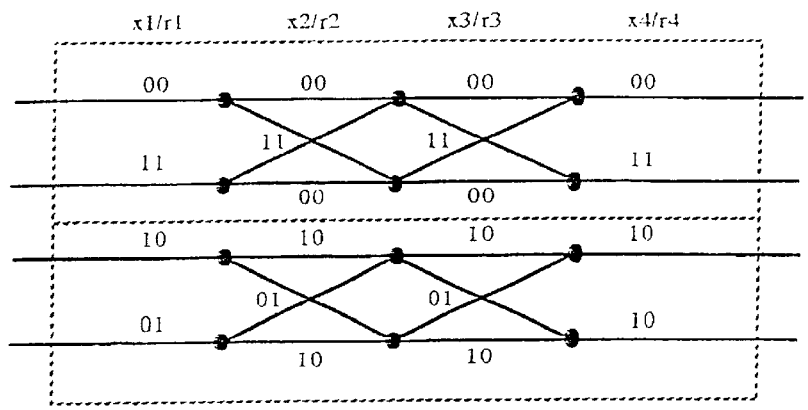
Figure 11:
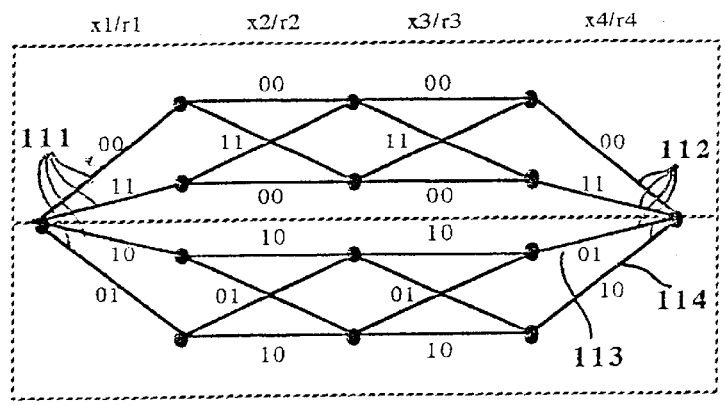
Figure 12:
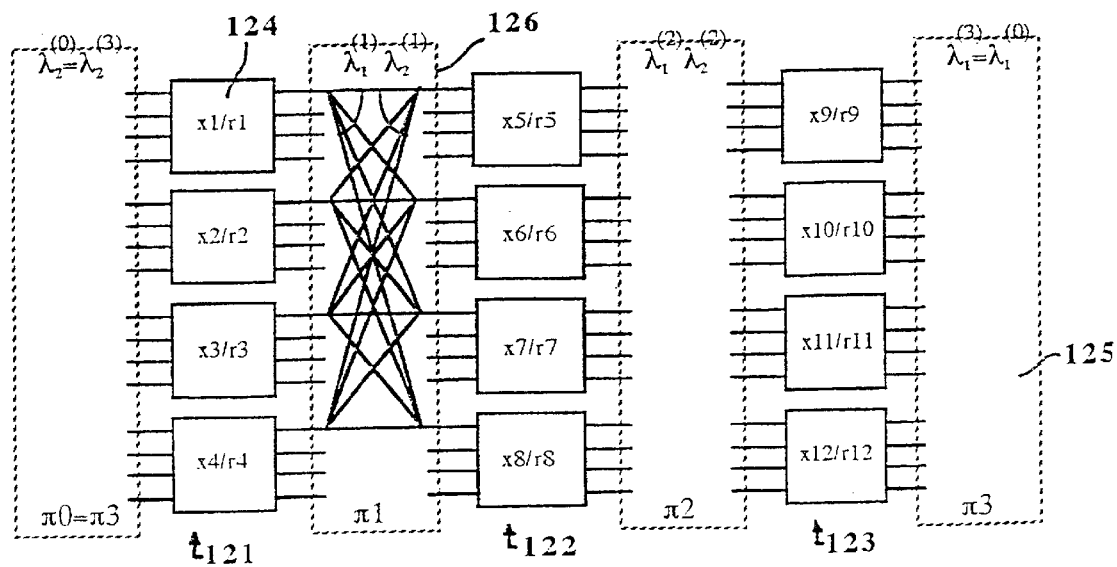
Figure 13:
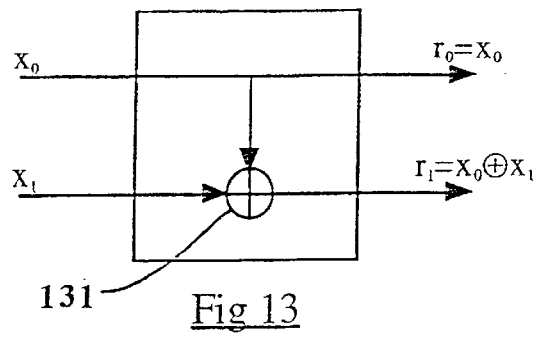
Figure 14:
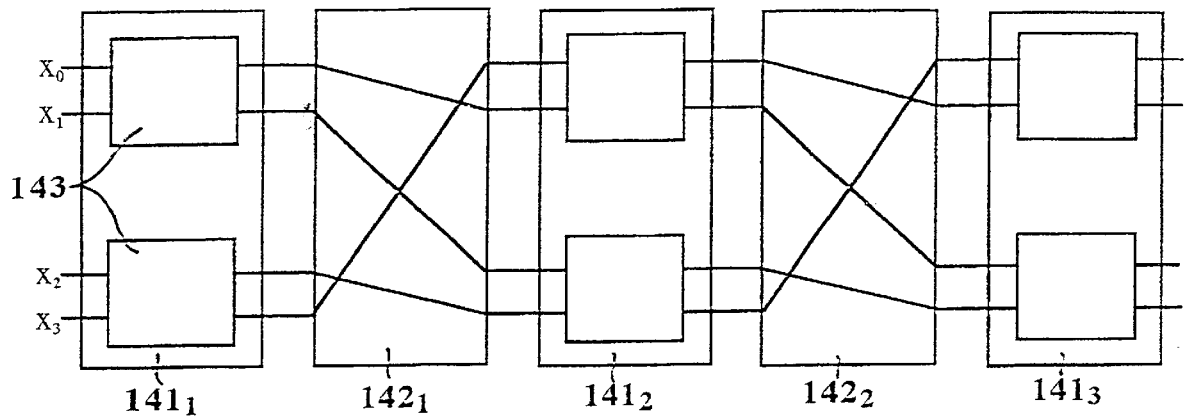
Figure 15:
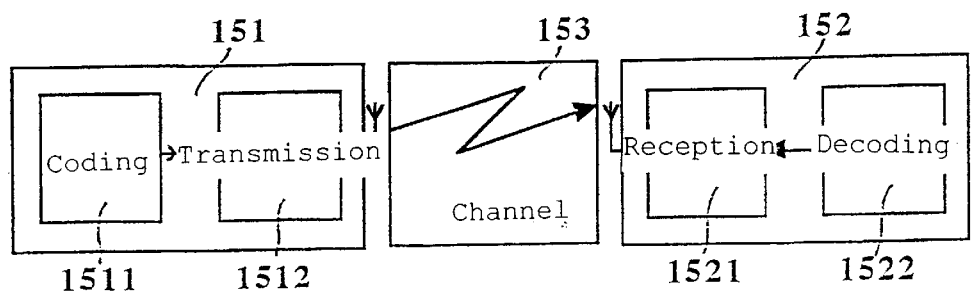

FIG. 6 presents the internal graph of the decoding module in FIG. 5B;

FIG. 7 is an advantageous swapping example used for producing optimum coding;

FIG. 8 is a coding example using the swap in FIG. 7 corresponding to a Golay code;

FIGS. 9, 10 and 11 illustrate trellis that can be used for coding according to the invention;

FIG. 12 is an example of a coder using the trellis in FIG. 9;

FIGS. 13 and 14 illustrate an example construction of a Hamming code [8, 4, 4] (that can be used as a basic module for building more complex codes according to the invention). FIG. 13 presents the basic coding module used in the scheme in FIG. 14;

FIG. 15 diagrammatically shows a transmission system using the technique according to the invention.

Therefore the technique according to the invention can be used to build quasi-optimum codes (referred to as "Cortex codes") to which a specific soft decision decoding method is used.

The quality of the results obtained is better than the quality of the results obtained by "turbo-codes". The minimum distance d for existing turbo-codes is fairly small. Therefore, for example, a Pyndiah block turbo-code that is a product code (32,26,4)×(32,26,4)=(1024,676,16) has a length code n=1024 for k=676 useful bits and a minimum distance d=16. Therefore with this block code, not more than $t=[(d-1)/2]=7$ errors can be corrected with a hard decision method.

Another example is a Berrou block turbo-code with a length of 192 bits (see Jung et al. [19]) and an efficiency of ⅓, that has an estimated minimum distance of 8 with an optimized interlacer. A "Cortex" code (192,96) with an efficiency of ½ has a minimum distance close to 30. The distribution of the weights of "cortex" codes thus apparently tends towards the binomial distribution which is the distribution of optimum random coding (see G. Battail [16]).

The general principle of the invention is based on the use of several coding modules organized according to the principle diagram in FIG. 2. These coding modules are grouped in at least 2 stages $21_1$ to $21n$. Each coding stage $21i$ comprises at least two coding modules $22i,j$ operating independently.

A mixing stage $23_1$ to $23n-1$ is inserted between each coding stage $21i$ and $21i+1$. Data output from each coding module in stage $22i$ are thus distributed between several coding modules in stage $22i+1$.

Preferably, this distribution is done so as to optimize the distribution of bits received from a single coding module.

In the described embodiment, the code used is a systematic blocks code. Therefore, the transmitted bits packet comprises useful bits 24, or source bits, and redundancy bits 25 output from the coder. Obviously, puncturing may be applied.

Figure 3:
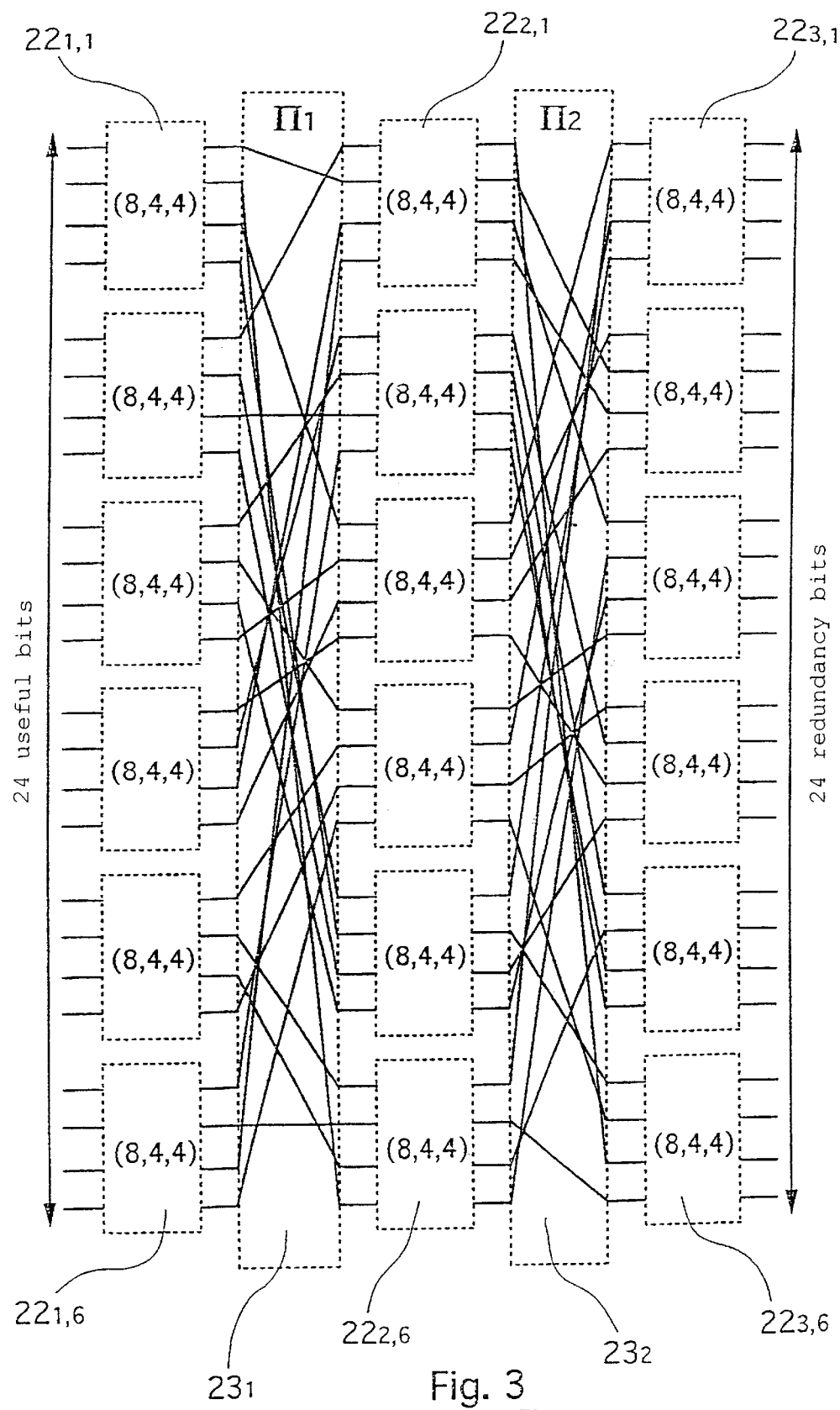
FIG. 3 is a particular example of a coding device according to FIG. 2.

According to one particular embodiment of the invention illustrated in FIG. 3, coding modules $22i,j$ are all identical and all use a Reed-Müller code (8,4,4). The result is a "Cortex" code (48,24).

The generating matrix of the Reed-Müller code used is as follows:

$$G = \begin{pmatrix} 1 & 0 & 0 & 0 & 0 & 1 & 1 & 1 \\ 0 & 1 & 0 & 0 & 1 & 0 & 1 & 1 \\ 0 & 0 & 1 & 0 & 1 & 1 & 0 & 1 \\ 0 & 0 & 0 & 1 & 1 & 1 & 1 & 0 \end{pmatrix}$$

If the four useful input bits are (x0, x1, x2, x3), the four redundancy bits are (x4, x5, x6, x7) such that:

$$\begin{cases} x_4 = x_1 + x_2 + x_3 \\ x_5 = x_0 + x_2 + x_3 \\ x_6 = x_0 + x_1 + x_3 \\ x_7 = x_0 + x_1 + x_2 \end{cases}$$

Each coding stage $21_1$, $21_2$ and $21_3$ comprises six basic coding modules (8,4,4) $22_{1,1}$ to $22_{3,6}$. The redundancy bits for the first coding stage $21_1$ are swapped P1 ($23_1$). This swapping may be considered as a "jungle of wires" that can give a good correction capacity if it is well chosen (for example by successive tests and simulation).

The second coding stage $21_2$ performs a new calculation of 24 new intermediate redundancy bits that are again swapped by the mixing stage Π2($23_2$). The method may thus use several coding stages.

Another even simpler basic code that can be used and that gives good results is a (4,2) code that for example associates the (c0, c1, c2, c3)=(x0, x1, X0, X0+x1) data with (x0, x1). This type of basic code makes it possible and easy to implement decoding cells in the form of precalculated tables, for example stored in ROM memories.

Obviously, all calculated bits can be transmitted with the useful bits. However, the efficiency of the code obtained will be low. It may be preferred to transmit only useful start bits 24 and redundancy bits 25 from the last stage.

It has been seen that the minimum distances of these codes are very good, and the weight distributions have "binomial distribution tails", in other words a very small number of neighbors after this minimum distance.

Figure 4:
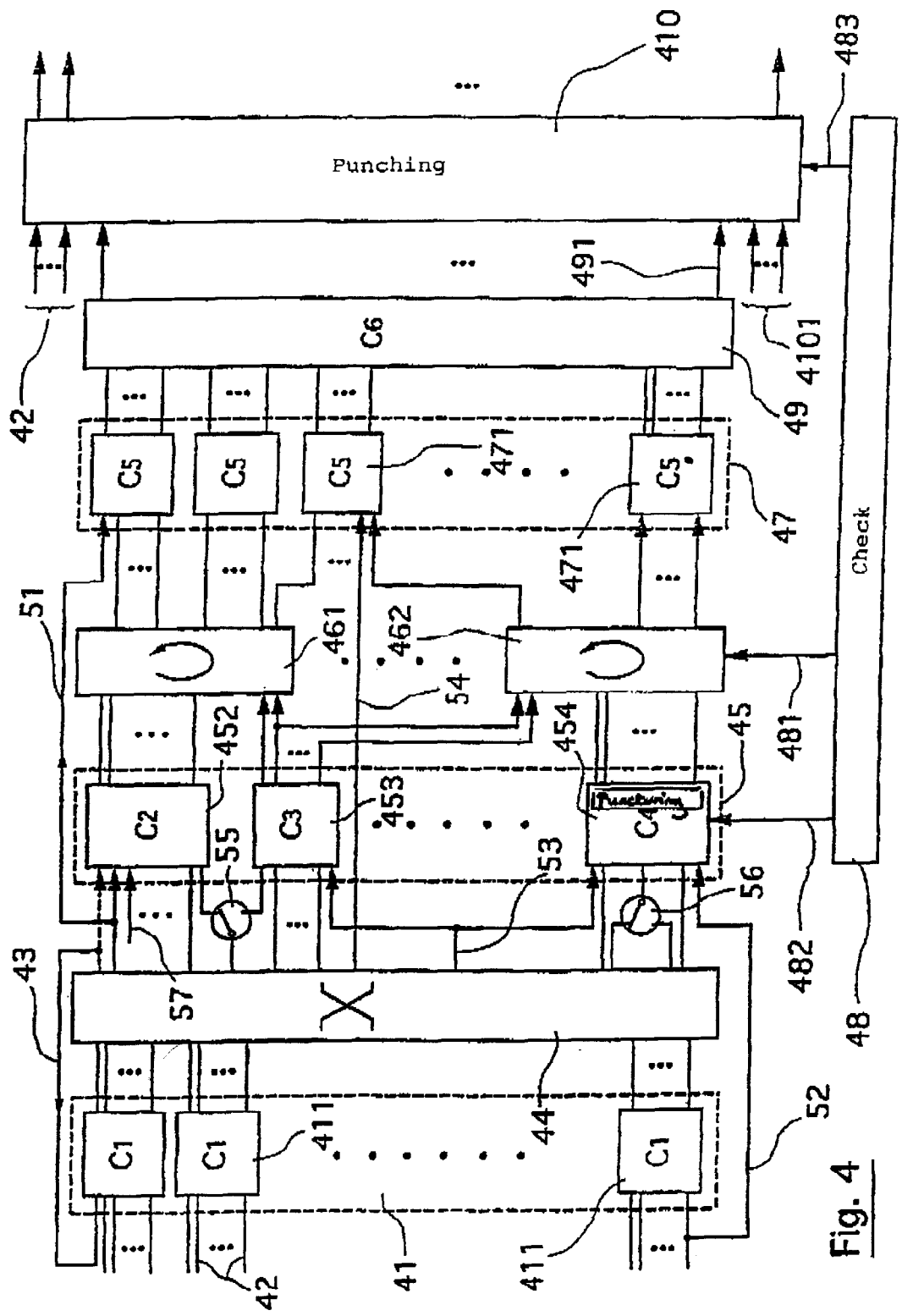
FIG. 4 illustrates other aspects that can be implemented in a coding device according to the invention.

A large number of variants and adaptations of this principle may be envisaged. FIG. 4 diagrammatically and fictitiously (in other words in a simplified manner for illustrative purposes) illustrates some of these variants and applications. Obviously, they may be implemented independently or in any appropriate combination.

FIG. 4 shows a first coding stage 41 comprising several identical coders C1 411. Source data 42 are input into these coders. They may also use intermediate data 43 "reinjected" from any position in the methoding line.

Data coded by these coding modules 411 are input into a swap matrix 44 that distributes data between a plurality of coders in a second coding stage 45. Unlike the first coding stage 41, this second coding stage 45 uses several distinct coders C2, C3, C4 452 to 454. These different codes may be of any appropriate type. For example, they may be chosen for their coding efficiency and/or the corresponding ease of decoding.

The next swap stage is composed of several mixing modules 461, 462 in which intermediate data received from the coding stage 45 are distributed variably to the various coding modules 471 in the next coding stage 47. This mixing 461, 462 may be regular, random or controlled as a function of information 481.

The transmission system may also comprise one or several codings C6 49 (for example performing coding and/or encryption) that applies to all data that it receives from the previous coding modules.

Puncturing 410 may be done at different points in the system and on different data. In the example illustrated, puncturing 410 is done on a set of data comprising:

the source data 42;

the data output from the last coding stage 491;

at least some of the intermediate data 4101.

More generally, data including source data 42 and intermediate data 4101, may be distributed in a very wide variety of ways within the methoding system.

The following cases are given as examples:

intermediate data 51 is sent to two separate coding stages 45 and 47 simultaneously;

source data 52 is "decoupled" in the same way between a coding module in the first coding stage 41 and a coding module in the coding stage 45;

data 53 is simultaneously input into two (or more) coding modules 453 and 454 in the same coding stage 45;

data 54 output from the swap stage 44 is input directly into the coding stage 47 (and not into the nearest stage 45);

data 55 is selectively directed to a first coding module 452 or a second coding module 453;

data 56 received by a coding module 454 selectively corresponds to two (or several) intermediate data;

source data 57 are input into a coding stage 45 other than the first coding stage 41 in the system.

Another possibility is that all or some of the source data could be directly input into a first coding unit formed of at least two coding stages and at least one intermediate mixing stage, and secondly a second coding unit after mixing (for example a swap) also formed of at least two coding stages and at least one intermediate mixing stage. This then gives two sets of redundancy data (obviously, on which puncturing is possible).

Obviously, these are simply examples that can be adapted and generalized.

Furthermore, many aspects of the methoding may be variable or controlled as a function of a variety of information such as, for example:

information on the transmission channel (noise level, noise types, etc.);

information on the decoder (methoding capacity, memorization capacity, etc.);

information on the transmitted data type (structure and/or characteristics of the data blocks, information type (images, sound, data), required coding quality, etc.);

an instruction given by a user;

etc.

Thus, the control module 48 can control:

the swaps or mixing that are done (481);

coding used (code types and/or characteristics of the code) (482);

puncturing (483).

The choice of codes used in coding modules takes account particularly of the efficiency and ease of decoding. Conventionally, a basic code will be chosen such that the value n−k is small. Preferably, swaps (or mixing) are chosen to give good diversity between Boolean functions on each output. More precisely, the choice will be made such that finally the Boolean function for each redundancy output bit is composed of a set of information bits that is as different as possible from the other redundancy output bits.

For example, an attempt may be made to find matrices and basic codes to create a known code, for example such as the Golay code (24, 12, 8). In particular, a trivial basic code (associating x0 with x0) could be used, for example together with the basic code mentioned above.

The following describes an embodiment for producing optimum codes.

This is done using very simple and very efficient bit swapping to build up codes according to the invention which is such that, for a swap length k, bits with even indexes $i=2p$ are sent to indexes $j=p$, $p=0, 1, \ldots, \text{int}[k/2]-1$ (where $\text{int}[x]$ is the function giving the integer part of x); and bits with odd indexes $i=2p+1$ are sent to indexes $j=p+\text{int}[k/2]$.

The swap for a length $k=12$, $\text{int}[k/2]=6$ is as follows:

| 0 | 1 | 2 | 3 | 4 | 5 | 6 | 7 | 8 | 9 | 10 | 11 |
|---|---|---|---|---|---|---|---|---|---|----|----|
| 0 | 2 | 4 | 6 | 8 | 10 | 1 | 3 | 5 | 7 | 9 | 11 |

This notation means that the bit with index 0 at the swap input is sent to output index 0, input bit 1 to output bit 2, input bit 2 to output bit 4, etc. The principle of this swap is shown in FIG. 7.

Obviously, identical swaps with a different offset will produce the same result.

If this swap 82 is used for a code with size [n=24, k=12] as shown in FIG. 8, using the extended Hamming code [8,4] with 3 stages as the basic code 81, the result will be the Golay code [24,12] with a minimum distance 8 which is known as being optimal.

For the same type of swap with length k=16 and 3 stages, the quadratic residual QR code [32,16] with a minimum distance of 8, also known as being optimal, is also found. In the same way for k=36, the QR [72,36,12] codes with 5 stages are obtained, and this code is already considered to be optimal.

The same principle can be used to build all end codes, regardless of the fixed minimum distance (more precisely, at least one corresponding optimal code can be constructed).

Thus, an example construction of the basic code 81 is described in relation to FIGS. 13 and 14. Thus, it is found that the principle of the invention can be nested on several levels.

FIG. 13 illustrates the elementary code used in each stage. It combines the (x0, x0+x1) pair with the (x0,x1) pair. It is very easy to build using a simple adder 131. Therefore its implementation on silicon is particularly attractive and it becomes very easy to build a complex code like that described above.

The Hamming code [8,4,4] may be made as illustrated in FIG. 14 using three coding stages 1411 to 1413, and two swap stages 1421 to 1422. Each coding stage 1411 to 1413 comprises two coding modules 143 as illustrated in FIG. 13.

Each swap stage 1411 to 1422 performs the same swap associating indexed outputs 0, 1, 2, 3 with inputs to the next stage with indexes 1, 2, 3, 0 respectively. A symmetric shift associating inputs 3, 0, 1, 2 may also be used.

The code types described above are called "Cortex-I Codes". We will now describe another embodiment called "Cortex-II Codes" in which the basic coders use trellis.

Therefore, we continue to use a structure composed of one or several layers (or stages) of basic cells (or blocks) related by swaps (or interlacers). The basic blocks are not small error correction codes like the Cortex-I, but are small trellis that form a set of paths that can be bijectively associated with a set of small code words. An example of a simple trellis block is shown in FIG. 9.

Another simple trellis block inspired and adapted from a Hamming code [8,4] is presented in FIGS. 10 and 11. Note that this trellis is different from a conventional trellis by the inversion of values associated with the two output branches 113 ("01") and 114 ("10"). This modification is essential to give a Hamming code, and there is nothing obvious about it.

FIG. 12 shows the architecture of this type of coder (24,12) with three stages 121, 122 and 123. In the case of this last trellis block, it is found that a conventional extended Hamming code trellis [8,4] is obtained by "splicing" the four input branches 111 and the four output branches 112 from the trellis block, as illustrated in FIG. 11.

Information bits xi and redundancy bits ri "label" the trellis branches of each trellis 124. A branch label is denoted xi/ri.

Another difference between the Cortex-I and Cortex-II coders is the ring or "looped back" structure; the outputs from the last stage are connected to the inputs of the first stage through a single "swap" 125 (other loop backs are also possible). In the example shown in FIG. 12, stage 123 and stage 121 are joined by a single swap (Π0=Π3).

Another difference between the Cortex-I and Cortex-II coders is the "swap" structure 126 between stages that distributes the same output of a stage 121 several times several (a number $\lambda_1^{(i)}$) times to several inputs of one (or several) subsequent stages 122. Furthermore, each input receives several (a number 12(i)) outputs rather than a single output.

Therefore, the coefficients $\lambda_1^{(i)}$ and $\lambda_2^{(i)}$ are the numbers of branches of inputs and outputs of "swaps" respectively, and can also be called "distributors". The sum of the metrics of the paths arriving at each of these convergence points will be found.

We will firstly describe the decoding algorithm, since these Cortex-II codes are designed starting from their decoding algorithm in order to minimize the decoding complexity. The received probabilities corresponding to transmitted bits xi/ri are used as branch metrics in trellis blocks. Addition-Comparison-Selection (ACS) operations will be carried out in trellis block nodes, for example as in a Viterbi type algorithm (hard or soft decisions). Metrics of paths converging on an input are then added at the output from swaps-distributions. The method is iterated from stage to stage iteratively in the network until convergence or until a maximum number of calculations has been done.

Decoded outputs are labels of the best surviving paths in the network.

Therefore, the coding is done based on the same structure as the decoding, by forcing xi bits to their transmission value bi. In transmission, all that are kept are the branches labeled with the values bi and other branches that are unused in this case are then chopped.

Coding will consist of converging by running through the coder several times, building up all possible paths and keeping only one maximum metric path passing through each trellis block. Therefore coding, which consists of calculating redundancy bits, is done using a "special" decoding in which there is no advance knowledge of the values of redundancy bits.

Obviously, identical swaps with a different fixed shift will have the same result.

The same principle is used to build all end codes, regardless of the fixed minimum distance (more precisely, at least one corresponding optimum code can be produced).

Therefore according to this technique called the "Cortex II", the following characteristics are thus used:
  use of simple "trellis blocks", therefore the basic codes being a trellis code with a predetermined relation (taking account of paths according to an adapted technique, such as a Viterbi decoding); distribution of each output branch from trellis blocks several ($\lambda_1^{(i)}$) times;
  combination of several ($\lambda_2^{(i)}$) outputs from the previous step at the inputs of "trellis blocks", in order to add the corresponding matrix (real numbers);
  produce the coding from the decoding (the coding is not known in advance). Decoding is applied to the coding, with maximum confidence on the bits to be transmitted xi (which are by definition known) and with zero confidence for redundancy bits ri;
  loop back from the last mixing stage to the first stage (in order to converge coding and decoding, running through the coder and decoder several times).

The invention also relates to the decoding method and device for data produced by the coding method described above, this decoding is relatively simple and inexpensive to implement. It is advantageously iterative, which makes it easier to implement and adapt.

Most conventional decoding techniques can be used. Thus, exhaustive decoding can be used in which all possible code words are considered and the best is selected based on a predetermined selection criterion. A Viterbi type decoding can also be used implementing a decoding trellis (for example using a SOVA or BJCR algorithm). Another possible technique is to use a decoding based on the Chase algorithm.

Advantageously, the decoding used has a structure corresponding to the structure of the coder described above. In other words, the decoder comprises several decoding stages each comprising several decoding modules and separated by swap stages.

This structure is easy to implement in the form of a pipeline machine, in VLSI.

FIG. 5B illustrates a decoding module corresponding to the coding module illustrated in FIG. 5A (using Reed-Müller coding (8,4,4)).

This decoding module is a decoder with weighted inputs and weighted outputs, for example produced using known techniques, such as the SOVA method. It implements additions and subtractions.

Each wire (input or output) in the coding module in FIG. 5A corresponding to one bit in the coder, is doubled up to two wires in the decoding module in FIG. 5B. These wires are used to communicate or propagate probability values from the input side to the output side of the decoder, or from the output side to the input side.

Calculations may be done in the decoder according to a particular sequence in order to minimize them. The first operation is to input received values of data probability and redundancy bits on the input wires. The probability value is equal to the log(probability (bit=0)/probability (bit=1)) ratio, which is proportional to the received value in the case of a Gaussian channel and in the case of a two state modulation (0, 1) associating (+1, −1).

Values not defined when the network is initialized are fixed to a predetermined value by default, advantageously zero.

Decoding is done as follows, with reference to the coder structure shown in FIG. 2 that is similar to the structure of the decoder:

- received probability values to be methoded are input into the end decoding stages (first and last stages);
- the new calculated values of probability are input into adjacent stages, and so on until reaching the central stage (if the number of decoding stages is odd) or the central stages (if the number of decoding stages is even);
- the method then follows the reverse path from central stages to the end stages, until the first and last stages.

All these steps are carried out in one iteration of the methoding. They are repeated either until a given number of iterations is reached, or until the iterations are stopped as a function of a criterion to minimize the sum of the absolute values or the square root of the squares of the variations between the incoming and outgoing probabilities for each wire from one iteration to the next, for at least one stage. Iterations may be stopped separately in each cell, in order to minimize the number of calculations.

It is checked that the input and output probabilities of a single bit in a decoding module tend to become stable as the number of iterations increases.

A preferred embodiment of the decoding, still based on the structure similar to the structure of the coder shown in FIG. 2, consists of doing a full propagation of the data with the path probabilities calculated by each cell (or module), in the direction towards the decoder input (from the beginning to the end, stage by stage), then in the output direction according to a forward-backward type principle.

Therefore, advantageously, decoding is based on path probabilities. The following describes an example decoding based on this approach.

A "Cortex code" is considered built with a unique basic code, the extended Hamming code (8,4,4) mentioned above. The corresponding code words c can be written as follows:

[c0 c1 c2 c3 c4 c5 c6 c7]

They are calculated starting from information bits x=[x0 x1 x2 x3] to be transmitted, by the vector-matrix product c=x.G.

Therefore, the basic code is composed of 16 words that may be considered as states. The decoder is based partly on the graph of this basic coder and its states, illustrated in FIG. 6.

States E0 to E15 represent code words (x0, x1, x2, x3, r0, r1, r2, r3) such that:

| | |
|---|---|
| E0 = 0000 0000, | E15 = 1111 1111, |
| E1 = 0001 1110, | E14 = 1110 0001, |
| E2 = 0010 1101, | E13 = 1101 0010, |
| E3 = 0011 0011, | E12 = 1100 1100, |
| E4 = 0100, 1011, | E11 = 1011 0100, |
| E5 = 0101 0101, | E10 = 1010 1010, |
| E6 = 0110 0110, | E9 = 1001 1001, |
| E7 = 0111 1000, | E8 = 1000 0111 |

A simple rule to be retained for this basic code is that if the number of information bits is odd, then the redundancy word is equal to the complement of the information word, and otherwise it is equal to it.

According to another approach, the basic code is represented by a trellis in which the labels are in the form (information bit, redundancy bit), as will be described below. In this case the (extrinsic information, extrinsic redundancy) pair is added to the (information input, redundancy input) pair.

It is considered that the coder shown in FIG. 3 is used, comprising three coding stages each comprising six coding modules. Therefore for this basic Hamming code (8,4), each stage comprises six basic coder/decoder cells. There is a swap matrix denoted Π between each coding/decoding stage.

The graphic description of the decoder is similar to the description of the coder, with the difference that the wires are duplicated (see FIGS. 5A and 5B) to propagate the probabilities of paths passing through internal states and the states of information and redundancy bits that form the inputs and outputs of the basic decoders.

The decoding method begins with the initialization of vectors of probability values of information bits X=(x0, ..., x23) and of received redundancy bits R=(r0, r1, ..., r23) (24 inputs and 24 outputs per stage) on the start and end stages (stages 1 and 3 in the example discussed).

Each elementary decoder calculates forward Fi and backward Bi probabilities, and then the probability Ei=Fi+Bi for each state (in this case i=0, 1, ..., 15).

The Fi probabilities are calculated using the probabilities of information bits, and the Bi probabilities are calculated using the probabilities of redundancy bits. For example, the forward probability F0 for state 0=0000 0000 is equal to the probabilities of paths from its component information bits:

$$F0=V(x0=0)+V(x1=0)+V(x2=0)+V(x3=0)$$

Similarly, the backward probability is determined:

$$B0=V(r0=0)+V(r1=0)+V(r2=0)+V(r3=0)$$

and the sum is then found E0=F0+B0

The state Ei is taken to be the same as its probability in order to simplify the annotation.

Therefore the decoding algorithm uses interactions (coding constraints) as a function of inputs V(xi) (forward path probabilities) and V(ri) (backward path probabilities) to produce the corresponding outputs V'(xi) and V'(ri).

Paths originating from the forward direction and paths originating from the backward direction meet (interact) on some states of a basic decoding cell. This interaction produces information that results in an extrinsic (or "a posteriori") probability value of the paths passing through these nodes in the decoding cell. But the part of the path probability originating from the same side, in this case the backward side is not propagated backwards, and the part originating from the forward side is not propagated forwards. This probability that is propagated backwards from this node is the extrinsic probability of the part of the path forward from this node, and correspondingly the part that is propagated forwards from this node is the extrinsic probability of the part of the path backward from this node.

The probability values of redundancy outputs are calculated by subtracting the logarithm of the sum Ei+Bi of the exponentials of the probabilities of the states and their "backward" probabilities of the states connected to the output xj, from twice the logarithm of the sum of the exponentials of the probabilities of the states Ei connected to this output xj. The probability values of information outputs are calculated in the same way using the sum of the exponentials of their forward probabilities Ei+Fi instead of their backward probabilities Ei+Bi.

More synthetically, the probabilities of the path propagated forwards are:

$$V'(xj) = \text{Log}[\Sigma \exp(Ei/xj \rightarrow Ei)] - \text{Log}\left[\frac{\Sigma \exp(Ei+Fi/xj \rightarrow Ei)}{\Sigma \exp(Ei/xj \rightarrow Ei)}\right]$$

which can be simplified as:

$$V(xj) = 2 \text{ Log}[\Sigma \exp(Ei/xj \rightarrow Ei)] - \text{Log}[\Sigma \exp(Ei+Fi/xj \rightarrow Ei)]$$

Symmetrically, the path probabilities propagated backwards are as follows:

$$V(rj) = 2 \text{ Log}[\Sigma \exp(Ei/rj \rightarrow Ei)] - \text{Log}[\Sigma \exp(Ei+Bi/rj \rightarrow Ei)]$$

where Ei/xj ? Ei is the probability of the state Ei being connected to the output node xj.

For example for nodes (x0=0) and (r0=0) in FIG. 6, we have:

$$V'(x0) =$$
$$2\text{Log}[e^{E0} + e^{E1} + e^{E2} + e^{E3} + e^{E4} + e^{E5} + e^{E6} + e^{E7}] - \text{Log}[e^{E0+F0} + e^{E1+F1} + e^{E2+F2} + e^{E3+F3} + e^{E4+F4} + e^{E5+F5} + e^{E6+F6} + e^{E7+F7}]$$

since the node (x0=0) is connected to the internal states of the coder with numbers {0, 1, 2, 3, 4, 5, 6, 7}, and $$V'(r0) =$$
$$2\text{Log}[e^{E0} + e^{E1} + e^{E2} + e^{E3} + e^{E4} + e^{E5} + e^{E6} + e^{E7}] - \text{Log}[e^{E0+B0} + e^{E1+B1} + e^{E2+B2} + e^{E3+B3} + e^{E4+B4} + e^{E5+B5} + e^{E6+B6} + e^{E7+B7}]$$

since the node (r0=0) is connected to the internal state of coder with numbers {0, 3, 5, 6, 8, 11, 13, 14}.

The above calculations can be simplified using the following approximation, if Ek>>Ei for i≠k:

$$V'(xj) = (Ek = \text{Max}(Ei/xj \rightarrow Ei) - Fk$$
$$V'(rj) = (Ek = \text{Max}(Ei/rj \rightarrow Ei) - Bk$$

These calculations can be done digitally using a micromethodor, or analogically for example with two-pole transistors or CMOS transistors that perform logarithm and exponential functions by construction (for example see references [20] and [21]).

The next step is to use these calculated values V' as the new inputs to decoding cells (or modules) in adjacent stages, and the calculations are started again for all cells, leaving the probabilities of received bits unchanged.

Regardless of the scheduling of the calculations, it is found that the decoder cells network always quickly converges towards global equilibrium.

The extrinsic probabilities V" of each bit can be extracted from this equilibrium by calculating the following starting from the probabilities of equilibrium states of cells in stages 1 and 3, after achieving this equilibrium:

$$V''(xj) = \text{Log}(\Sigma \exp(Ei/(xj=0) \rightarrow Ei) - \text{Log}(\Sigma \exp(Ei/(xj=1) \rightarrow Ei))$$

which can be simplified using the following approximation:

$$V''(xj) = (Ek0 = \text{Max}(Ei/(xj=0) \rightarrow Ei)) - Ek0 = \text{Max}(Ei/(xj=1) \rightarrow Ei))$$

The complexity of the calculations in this algorithm is of the order O(Nlog(N)) and convergence is fast due to the graph mixing properties. The decoder according to the invention gives very good error correction (particularly due to dispersion due to swap matrices) and very good convergence (decoding speed).

Many variants to the invention could be envisaged, with a wide variety of applications, particularly in the transmissions domain (transmission of multimedia signals, digital television, radiotelephony signals, etc.), for example within the ITU project entitled "IMT 2000", or for speech recognition, coding or understanding (for example for manipulation of Markov fields).

When the invention is used for transmission or broadcasting of signals, it will be noted that the coder can advantageously perform the source coding and channel coding in a single operation. Similarly in this case, the decoder performs channel decoding and source decoding simultaneously. Advantageously, the decoder also (at least partly) equalizes the transmission channel.

The specific structure of the coder and the decoder offers good flexibility, and in particular the "Cortex Code" used can be modified by modifying the basic codes and/or the swaps used. The decoder could adapt to the code used as a function of specific information transmitted to it, or by learning done on a reference sequence that it knows in advance, or by blind learning based directly on received data.

This decoder flexibility also provides tolerance to failures; for example failure of a decoding module does not prevent decoding from converging.

Furthermore, a decoder may also be used for coding, in which case redundancy inputs are forced to 0 and the corresponding information inputs correspond to the data to be coded. In this case a search is made for equilibrium, in the same way as for decoding.

In this case, it can be used alternately firstly for coding and secondly for decoding data, for example for duplex type applications. A single item of equipment is then sufficient to perform the coding and decoding functions.

The invention applies to coding of signals, and also to transmission and reception of signals.

FIG. 15 illustrates a transmission system according to the invention.

The transmission device 151 comprises coding means 1511 according to the invention, which could possibly perform the source coding and the channel coding (we have seen that several operations on the signals may be accumulated), and transmission means 1512 that may be simpler (particularly power and/or filtering) and therefore less expensive, than means used in known devices, all other things being equal.

Similarly, the reception device 152 comprises simpler and therefore less expensive reception means 1521, since the coding efficiency can compensate for transmission errors in the decoding means 1522.

Correspondingly with the invention, transmissions can be envisaged in channels 153 with more disturbance than would normally be tolerated, and therefore other applications and/or higher transmission rates can also be envisaged.

APPENDIX

[1] F. J. MacWilliams, N. J. A. Sloane. "The Theory of Error-Correcting Codes", North-Holland, 3rd edition, 1981.
[2] S. B. Wicker, "Error Control Systems for Digital Communication and Storage", Prentice Hall, 1995.
[3] V. Pless et al. "The Handbook of Coding Theory", Elsevier, 1998.
[4] C. E. Shannon, "A Mathematical Theory of Communication", Bell System Technical Journal, pp. 379–423 and 623–656, no 27, 1948.
[5] P. Elias, "Coding for Noisy Channels", IRE Conv. Record, Part 4, pp. 37–47, 1955.
[6] A. J. Viterbi, "Error bounds for convolutional codes and an asymptotically optimum decoding algorithm", IEEE, IT13, pp. 260–269, 1967.
[7] G. D. Forney Jr., "The Viterbi algorithm", Proceedings of the IEEE, Vol. 61, pp. 268–276, March 1969.
[8] R. E. Bellman, "Dynamic programming", Princeton University Press, 1965.
[9] R. J. McEliece, "On the BCJR Trellis for linear block codes", IEEE, IT Vol. 42, pp. 1072–1092, July 1996.
[10] C. Berrou, A. Glavieux, P. Thitimajshima, "Near Shannon Limit Error-Correcting Coding and Decoding: Turbo-Codes", Proceedings of the ICC'93, Geneva, Switzerland, May 1993, pp. 1064–1070.
[11] L. R. Bahl, J. Cocke, F. Jelinek, J. Raviv: "Optimal decoding of linear codes of minimizing symbol error rate", IEEE, Vol. IT20, pp. 284–287, March 1974.
[12] G. Battail, "Pondération des symboles décodés par l'algorithme de Viterbi" (Weighting of symbols decoded by the Viterbi algorithm), Annales des télécommunications, Vol. 31, No. 1–2, pp. 31–38, January–February 1987.
[13] H. Hagenauer, P. Robertson, L. Papke, "Iterative turbo decoding of systematic convolutional codes with the MAP and the SOVA algorithms", in Proc. ITG'94, 1994.
[14] R. Pyndiah, A. Glavieux, A. Picard, S. Jacq, "Near optimum decoding of products codes", Proc. GLOBECOM'94, San Francisco, CA, December 1994, pp. 339–343.
[15] C. Berrou, A. Glavieux, "Near Optimum Error Correcting Coding and Decoding: Turbo-codes", IEEE, Vol. IT44, No. 10, October 1996, pp. 1261–1271.
[16] G. Battail, "A conceptual framework of understanding turbo-codes", International Symposium on turbo-codes. ENST-Brest, September 1997, pp. 55–62.
[17] C. Berrou, M. Jézéquel, "Frame-oriented convolutional turbo-codes", Electronics letters, 18th Jul. 1996, Vol. 32, No. 15, pp. 1362–1364.
[18] P. Adde, R. Pyndiah, C. Berrou, "Performance of hybrid turbo codes", Electronics Letters, 21th Nov. 1996, Vol. 32, No. 24, pp. 2209–2210.
[19] P. Jung, M. Naban, "Performance evaluation of turbo codes for short frame transmission systems", Electronics Letters, 20th Jan. 1994, Vol. 30, No. 2, pp. 111–113.
[20] Hagenauer, M. Winklhofer "the analog decoder", ISIT'98, page 145, 21 Aug. 1998, Cambridge, MA, USA.
[21] H. A. Loeliger, F. Lustenberger, M. Helfenstein, F. Tarkoy "Probability propagation and decoding in analog VLSI", ISIT'98, page 146, Aug. 21, 1998, Cambridge, MA, USA.

What is claimed is:

1. Error correction coding method of the type associating a series of source data with a block of coded data to be transmitted to at least one receiver, comprising:

at least two coding steps ($21_i$) each performed by at least two basic coding modules ($22_{i,j}$), each of the said coding steps receiving a series of data to be processed, distributed between the said basic coding modules, and outputting a series of processed data from the said basic coding modules;

and at least one mixing step ($23_i$), the said mixing step being inserted between two successive coding steps, a first coding step and a second coding step, distributing the processed data output from each basic coding module in the said first coding step between at least two basic coding modules in the said second step;

said block of coded data to be transmitted comprising at least some of said source data and at least some processed data output from the last coding stage.

2. Coding method according to claim 1, characterized in that the coded data block to be transmitted comprises all the said source data.

3. Coding method according to claim 1, characterized in that the said coded data block comprises processed data output from at least two coding steps.

4. Coding method according to claim 1, characterized in that at least one of the said mixing steps uses at least one swap matrix.

5. Coding method according to claim 1, characterized in that at least one of the said mixing steps distributes the processed data to at least two distinct coding steps.

6. Coding method according to claim 1, characterized in that at least one item of the said source data and/or at least one item of the said processed data may be duplicated (51) at least once, in order to form at least two items of data to be processed.

7. Coding method according to claim 1, characterized in that at least one of the said source data is directly input (52,57) into a coding step other than the first coding step.

8. Coding method according to claim 1, characterized in that it includes puncturing means applied to at least some of the said data to be processed and/or on at least some of the said processed data.

9. Coding method according to claim 1, characterized in that the said coding modules ($22_{i,j}$) use a redundancy code with length n–k less than or equal to 12.

10. Coding method according to claim 1, characterized in that the said basic coding modules are built using elementary coding blocks associating the (x0, x0+x1) pair with the (x0, x1) pair.

11. Coding method according to claim 1, characterized in that at least two of the said coding modules (411, 452, 453, 454, 471) are different.

12. Coding method according to claim 1, characterized in that at least some coding modules ($22_{i,j}$) use at least one code belonging to the group containing:

a (4,2) code, for example that associates the values (x0, x1, x0, x0+x1) with the (x0, x1) pair;

a trivial code that associates x0 with x0.

13. Transmission and/or reception method comprising a step in which at least one coded signal is transmitted according to the method in claim 1.

14. Application of the coding method according to claim 1, to at least one of the techniques belonging to the group comprising:

transmission and/or broadcasting of digital signals;

speech recognition and/or processing.

15. Coding method according to claim 1, characterized in that it uses at least two coding units each performing at least two of the said coding steps and at least one mixing step inserted between two successive coding steps, and in that the said source data are input into each of the said coding units in different input orders.

16. Coding method according to claim 15, characterized in that it uses at least one mixing unit, modifying the order in which the said source data are input into one of the said coding units.

17. Coding method according to claim 1, characterized in that all the said coding modules are identical ($22i,j$).

18. Coding method according to claim 17, characterized in that each of the said coding modules ($22_{i,j}$) uses a Reed-Müller code.

19. Coding method according to claim 1, characterized in that at least one of the said mixing steps uses a "parity" swap that groups inputs with even indexes, and inputs with odd indexes, at the output.

20. Coding method according to claim 19, characterized in that the swap performs the following operations for a swap length k:
  inputs with even indexes i=2p are sent to outputs j=p, p=0, 1, ... int[k/2]−1;
  inputs with odd indexes i=2p+1 are sent to outputs j=p int[k/2],
where int[x] is the function giving the integer part of x.

21. Coding method according to either of claim 19, characterized in that it uses mixing steps involving a parity swap, and that it comprises:
  three coding steps each performed by three basic coding modules;
  three coding steps each performed by four basic coding modules;
  five coding steps each performed by nine basic coding modules,
the said basic coding modules using an extended Hamming code [8,4].

22. Coding method according to claim 1, characterized in that at least one of the said mixing steps generates at least one output that is a function of at least two inputs to the said mixing step.

23. Coding method according to claim 22, characterized in that the said function can use at least one summation, a multiplication and/or a weighting.

24. Coding method according to claim 1, characterized in that it comprises a step (48) in which at least one of the following elements is checked and/or adjusted:
  coding type and/or characteristic used by at least one of the basic coding modules;
  mixing used by at least one of the said mixing steps;
  punching used on at least some of the said data to be processed and/or on at least some of the said processed data;
  number of coding steps.

25. Coding method according to claim 24, characterized in that the said check and/or the said adjustment acts systematically on a given period and/or as a function of at least one item of information representative of at least one of the aspects belonging to the group including:
  at least one characteristic of the transmission channel;
  at least one characteristic of the receiver;
  at least one characteristic of the source signal.

26. Coding method according to claim 1, characterized in that at least one of the said basic coding modules ($22i,j$) is used in a trellis defining a set of paths bijectively associated with a set of code words, and outputting optimum path metrics according to a predetermined criterion.

27. Coding method according to claim 26, characterized in that the said inputs to the said function are path metrics.

28. Coding method according to claim 26, characterized in that the said coding and mixing steps are iterated at least twice.

29. Coding method according to claim 26, characterized in that the said coding and mixing steps are identical to the decoding and mixing steps used during decoding, the coding being initialized by forcing the redundancy bits to 0, and the coding consisting of only keeping the metrics for the maximum path of each coding module.

30. Error correction coding device of the type that associates a coded data block with a series of source data, the coded data block to be transmitted to at least one receiver, comprising:
  at least two coding stages each using at least two basic codings, each of the said coding stages receiving a series of data to be processed, distributed between the said basic codings and outputting a series of processed data corresponding to the said basic codings;
  and at least one mixing stage, the said mixing stage being inserted between two successive coding stages, a first coding stage and a second coding stage, and distributing the processed data corresponding to each basic coding of the said first coding stage between at least two basic codings of the second stage;
  said block of coded data to be transmitted comprising at least some of said source data and at least some processed data output from the last coding stage.

31. Coded signal produced by an error correction coding method, of the type associating a coded data block with a series of source data, the coded data block to be transmitted to at least one receiver, comprising:
  at least two coding steps ($21_i$) each performed by at least two basic coding modules ($22i,j$), each of the said coding steps receiving a series of data to be processed distributed between the said basic coding modules, and outputting a series of processed data corresponding to the said basic coding modules;
  and at least one mixing step ($23_j$), the said mixing step being inserted between two successive coding steps, a first coding step and a second coding step, and distributing the processed data output from each basic coding module performing the said first coding step between at least two basic coding modules of the said second step,
  the said coded signal comprising at least some of the said source data and at least some processed data output by the last coding stage.

32. Method for decoding a data block coded by an error correction coding method, of the type associating a block of coded data with a series of source data, the coded data block to be transmitted to at least one receiver, comprising:
  at least two coding steps ($21_i$) each performed by at least two basic coding modules ($22_{i,j}$), each of the said coding steps receiving a series of data to be processed distributed between the said basic coding modules, and outputting a series of processed data corresponding to the said basic coding modules;
  and at least one mixing step ($23_j$), the said mixing step being inserted between two successive coding steps, a first coding step and a second coding step, and distributing the processed data output from to each basic coding module of the said first coding step between at least two basic coding modules of the said second step,
  the said data block performed by at least some of the said source data and at least some processed data output by the last coding stage.

33. Decoding method according to claim 32, characterized in that it is iterative.

34. Decoding method according to claim 32, characterized in that it is used as a coding method with the redundancy inputs being forced to 0 and the information inputs corresponding to the data to be coded.

35. Decoding method according to claim 34, characterized in that it is used alternately firstly for coding and secondly for decoding data.

36. Decoding method according to claim 32, characterized in that it uses at least one of the techniques belonging to the group comprising:
   decoding using a structure symmetrical to the structure used during coding;
   exhaustive decoding, according to which all possible code words are considered and the best is selected according to a predetermined selection criterion;
   Viterbi type decoding, using a decoding trellis;
   Chase decoding.

37. Decoding method according to claim 36, characterized in that it uses at least two decoding steps, performed by at least two decoding modules, and at least one swap step inserted between two consecutive decoding steps, the said steps being symmetric with the corresponding coding steps, and in that each of the said decoding modules comprises twice as many inputs and outputs as the corresponding coding module, to assure propagation of probability values from the input to the output side of the decoder, and secondly from the output to the input side of the said decoder.

38. Decoding method according to claim 36, characterized in that it includes at least one iteration of the following operations:
   propagation of all the said probability values towards the input side of the said decoder, producing a first set of estimated values;
   propagation of all the said probability values towards the output side of the said decoder, producing a second set of estimated values.

39. Decoding method according to claim 38, characterized in that it forms a summation of the estimated values of each of the said sets of estimated values, the next iteration being made on the results of the said summation.

40. Decoding method according to claim 39, characterized in that, for each output from one of the said decoding modules, it takes account of a Boolean function depending on at least two inputs to the corresponding coding module, and in that a decoding constraint imposes that an output side output from a given decoding stage must be equal to the corresponding input side output of the next decoding stage.

41. Decoding method according to claim 32, characterized in that it determines path probabilities.

42. Decoding method according to claim 41, characterized in that the said probabilities are determined from probability laws.

43. Decoding method according to claim 41, characterized in that at least one of the said basic decoding modules use a trellis with nodes in which addition, comparison and/or selection operations are carried out and that output optimum path metrics and in that additions, multiplications and/or weightings of at least two of the said optimum path metrics are carried out in at least one of the said mixing steps.

44. Decoding method according to claim 43, characterized in that the said coding method is a coding method in which the said coding and mixing steps are iterated at least twice, the first and last mixing steps forming a single step.

45. Decoding method according to claim 41, characterized in that in each iteration, each of the said elementary decoding operations determines a state probability for each possible corresponding coding state, and the state with the highest probability can be selected.

46. Decoding method according to claim 45, characterized in that the said state probability corresponds to the sum of a first probability value obtained starting from information bits and a second probability value obtained from redundancy bits.

47. Decoding method according to claim 46, characterized in that the said first (or second) probability associated with a given output from one of the said elementary decodings may be obtained by determining the logarithm of the sum of the exponentials of the probabilities of states connected to the said output, minus the logarithm of the sum of the exponentials of the probabilities received at the input, as information bits (or redundancy bits) for states connected to the said output.

48. Decoding method according to claim 47, characterized in that when the decoding has reached a predetermined convergence criterion, possibly independent for each coding module, an a posteriori probability is associated with each bit:

$$V''(xj)=\text{Log}(\Sigma \exp(Ei/(xj=0)\rightarrow Ei)-\text{Log}(\Sigma \exp(Ei/(xj=1)\rightarrow Ei))$$

49. Decoding method according to claim 47, characterized in that it comprises the following steps:
   calculate state probabilities:
      "forwards": $F_i$, based on information bits;
      "backwards": $B_i$, based on redundancy bits;
   calculate global state probabilities: $E_i=F_i+B_i$;
   detect the maximum state probability $E_i$;
   calculate the following probability values:

$$V(xj)=2 \text{ Log}[\Sigma \exp{-Ei/xj-Ei)]-\text{Log}[\Sigma \exp(Ei+Fi/xj-Ei)]$$

(values propagated backwards, thus giving the information bits xj)

$$V(rj)=2 \text{ Log}[\Sigma \exp{-Ei/rj-Ei)]-\text{Log}[\Sigma \exp(Ei+Bi/rj-Ei)]$$

(values propagated forwards, thus giving the redundancy bits rj)
   where (Ei/xj→Ei) represents the probability of state Ei connected to output xj.

50. Decoding method according to claim 49, characterized in that the said step to calculate the probability values is simplified by only including the state with the greatest probability in each of the exponential sums.

51. Method for processing data that can be used for coding and for decoding data, comprising:
   at least two coding/decoding steps ($21_j$) each performed by at least two basic coding modules ($22_{i,j}$), each of the said coding/decoding steps receiving a series of data to be processed distributed between the said basic coding modules, and outputting a series of processed data, corresponding to the said basic coding modules;
   and at least one mixing step ($23_j$), the said mixing step being inserted between two successive coding/decoding steps, a first coding/decoding step and a second coding/decoding step, and distributing the processed data output from each basic coding/decoding module of the said first coding step between at least two basic coding modules of the said second step.

52. Method for processing data according to claim 51, characterized in that at least some of the said calculations are made using preprogrammed tables.

53. Method for processing data according to claim 51, characterized in that at least some of the said calculations are done using analog components.

54. Method for processing data according to claim 51, characterized in that at least one of the said elementary codings and/or at least one or the said elementary decodings and/or at least one or the said elementary mixings can be programmed.

55. Method for processing data according to claim 54, characterized in that programmable decoding elements are programmed using at least one of the following operating methods:

as a function of a predetermined command produced by coding;

as a function of a reference sequence coded by coding;

by blind learning starting from the received data.

56. Method for processing data according to claim 51, characterized in that the said coding performs combined source coding and channel coding, and the said decoding correspondingly performs combined channel decoding and source decoding.

57. Coding and/or decoding method according to claim 56, characterized in that the said decoding also at least partially equalizes transmission channel effects.

58. Method for processing data according to any claim 51, characterized in that at least one of the said basic coding and decoding modules use a trellis, and in that the said coding and mixing steps for coding, and the said decoding and mixing steps for decoding, are identical.

59. Method for processing data according to claim 58, characterized in that the same structure is used for coding and decoding.

60. Method for processing data according to claim 58, characterized in that said trellis is a trellis like that illustrated in FIG. 11, for which the output labels "01" and "10" are reversed.

61. Device for decoding a coded data block of a coded signal comprising at least some source data and at least some processed data output by a last coding stage of a coding method, characterized in that it comprises:

at least two decoding stages each using at least two basic decodings, each of the said decoding stages receiving a series of data to be processed, distributed between the said basic decodings and outputting a series of processed data corresponding to the said basic decodings;

and at least one mixing stage, the said mixing stage being inserted between two successive decoding stages, a first decoding stage and a second decoding stage, and distributing the processed data corresponding to each basic decoding of the said first decoding stage between at least two basic decodings of the second stage;

said block of decoded data to be transmitted comprising at least some of said source data and at least some processed data output from the last decoding stage.

62. Transmission and/or reception method comprising a step in which at least one decoded signal is transmitted according to the method in claim 61.

63. Application of the decoding method according to claim 61, to at least one of the techniques belonging to the group comprising:

transmission and/or broadcasting of digital signals;

speech recognition and/or processing.

* * * * *